US010235480B2

(12) United States Patent
Broodney et al.

(10) Patent No.: US 10,235,480 B2
(45) Date of Patent: Mar. 19, 2019

(54) SIMULATION OF INTERNET OF THINGS ENVIRONMENT

(71) Applicant: International Business Machines Corporation, Armonk, NY (US)

(72) Inventors: Henry Broodney, Haifa (IL); Lev Greenberg, Haifa, NY (US); Michael Masin, Haifa (IL); Evgeny Shindin, Nesher (IL)

(73) Assignee: International Business Machines Corporation, Armonk, NY (US)

( * ) Notice: Subject to any disclaimer, the term of this patent is extended or adjusted under 35 U.S.C. 154(b) by 164 days.

(21) Appl. No.: 15/182,630

(22) Filed: Jun. 15, 2016

(65) Prior Publication Data

US 2017/0364612 A1 Dec. 21, 2017

(51) Int. Cl.
*G06F 9/44* (2018.01)
*G06F 13/10* (2006.01)
*G06F 13/12* (2006.01)
*G06F 17/50* (2006.01)

(52) U.S. Cl.
CPC .................. *G06F 17/5009* (2013.01)

(58) Field of Classification Search
CPC ............................ G06F 17/5009; G06F 17/50
USPC ...................................................... 703/21, 13
See application file for complete search history.

(56) References Cited

U.S. PATENT DOCUMENTS

2016/0357188 A1* 12/2016 Ansari ................. G05D 1/0212

FOREIGN PATENT DOCUMENTS

| CN | 202649996 | | 1/2013 |
| CN | 104035752 | | 9/2014 |
| CN | 104601665 | | 5/2015 |
| CN | 104601665 A | * | 5/2015 |
| CN | 102946616 | | 7/2015 |
| CN | 104767829 | | 7/2015 |

OTHER PUBLICATIONS

Kim, Seon-Min et al., "IoT Home Gateway for Auto-Configuration and Management of MQTT Devices", 2015, IEEE Conference on Wireless Sensors, IEEE.*

(Continued)

*Primary Examiner* — Cedric Johnson
(74) *Attorney, Agent, or Firm* — Ziv Glasberg

(57) ABSTRACT

A method, system, and product for simulation of Internet of Things (IoT) environment. The method performed by a simulation node in the IoT environment, which comprises the simulation node and a cloud server connected by a computerized network. The method comprises selecting a simulated IoT device to simulate from a plurality of simulated IoT devices that are being simulated by the simulation node; invoking a real-world model to obtain real-world simulated values; determining a simulated behavior of the selected simulated IoT device by invoking a device model and providing the real-world simulated values thereto, o wherein the simulated behavior comprises transmitting a message to the cloud server; setting a next simulated action of the simulation node to occur at a designated time, wherein the next simulated action is the simulated behavior; and performing the next simulated action at the designated time.

12 Claims, 7 Drawing Sheets

(56) References Cited

OTHER PUBLICATIONS

Atzori, Luigi et al., "The Social Internet of Things (SIoT)—When Social Networks meet the Internet of Things: Concept, Architecture, and Network Characterization", Aug. 2, 2012, Computer Networks 56, Elsevier B.V. (Year: 2012).*

Salman, Ola et al., "Edge Computing Enabling the Internet of Things", 2015, IEEE. (Year: 2015).*

Hu Xiangdong et al., "Model and simulation of creditability-based data aggregation for the internet of things", Chinese Journal of Scientific Instrument, Nov. 2011.

* cited by examiner

SIMULATION OF INTERNET OF THINGS ENVIRONMENT

TECHNICAL FIELD

The present disclosure relates to device simulation in general, and to simulation of an Internet of Things (IoT) environment comprising IoT devices, in particular.

BACKGROUND

The Internet of Things (IoT) refers to network of devices having network connectivity enabling the devices to collect and exchange data. In most cases, IoT devices are not associated with any user, and instead they may represent a physical object and monitor its behavior, such as using embedded sensors and electronics. The IoT may allow objects to be sensed and controlled remotely across existing network infrastructure, creating opportunities for direct integration of the physical world into is computer-based systems, and resulting in improved efficiency, accuracy and economic benefit.

Experts estimate that the IoT will consist of almost 50 billion objects by 2020.

IoT may include thousands to millions devices connected through a single cloud application. Simulation is an important analytical tool for better design and operation. The huge scale of IoT systems make its simulation challenging or even computationally infeasible, thus considerably reducing options for optimization IoT applications.

BRIEF SUMMARY

One exemplary embodiment of the disclosed subject matter is a method performed by a simulation node in an Internet of Things (IoT) environment, the simulation node comprising memory and a processor, the IoT environment comprises the simulation node and a cloud server connected by a computerized network, the method comprising: selecting a simulated IoT device to simulate from a plurality of simulated IoT devices that are being simulated by the simulation node; invoking a real-world model to obtain real-world simulated values; determining a simulated behavior of the selected simulated IoT device by invoking a device model and providing the real-world simulated values thereto, wherein the simulated behavior comprises transmitting a message to the cloud server; setting a next simulated action of the simulation node to occur at a designated time, wherein the next simulated action is the simulated behavior; and performing the next simulated action at the designated time.

Another exemplary embodiment of the disclosed subject matter is a simulation node in an Internet of Things (IoT) environment, wherein the IoT environment comprises the simulation node and a cloud server connected by a computerized network, wherein the simulation node comprising: a memory; and a processor, wherein the processor is configured to perform a method comprising: selecting a simulated IoT device to simulate from a plurality of simulated IoT devices that are being simulated by the simulation node; invoking a real-world model to obtain real-world simulated values; determining a simulated behavior of the selected simulated IoT device by invoking a device model and providing the real-world simulated values thereto, wherein the simulated behavior comprises transmitting a message to the cloud server; setting a next simulated action of the simulation node to occur at a designated time, wherein the next simulated action is the simulated behavior; and performing the next simulated action at the designated time.

Yet another exemplary embodiment of the disclosed subject matter is a computer program product to be executed by a simulation node in an Internet of Things (IoT) environment, wherein the IoT environment comprises the simulation node and a cloud server connected by a computerized network, wherein the computer program product comprising a computer readable storage medium retaining program instructions, which program instructions when read by a processor of the simulation node, cause the processor to perform a method comprising: selecting a simulated IoT device to simulate from a plurality of simulated IoT devices that are being simulated by the simulation node; invoking a real-world model to obtain real-world simulated values; determining a simulated behavior of the selected simulated IoT device by invoking a device model and providing the real-world simulated values thereto, wherein the simulated behavior comprises transmitting a message to the cloud server; setting a next simulated action of the simulation node to occur at a designated time, wherein the next simulated action is the simulated behavior; and performing the next simulated action at the designated time.

THE BRIEF DESCRIPTION OF THE SEVERAL VIEWS OF THE DRAWINGS

The present disclosed subject matter will be understood and appreciated more fully from the following detailed description taken in conjunction with the drawings in which corresponding or like numerals or characters indicate corresponding or like components. Unless indicated otherwise, the drawings provide exemplary embodiments or aspects of the disclosure and do not limit the scope of the disclosure. In the drawings.

DETAILED DESCRIPTION

Figure 1:
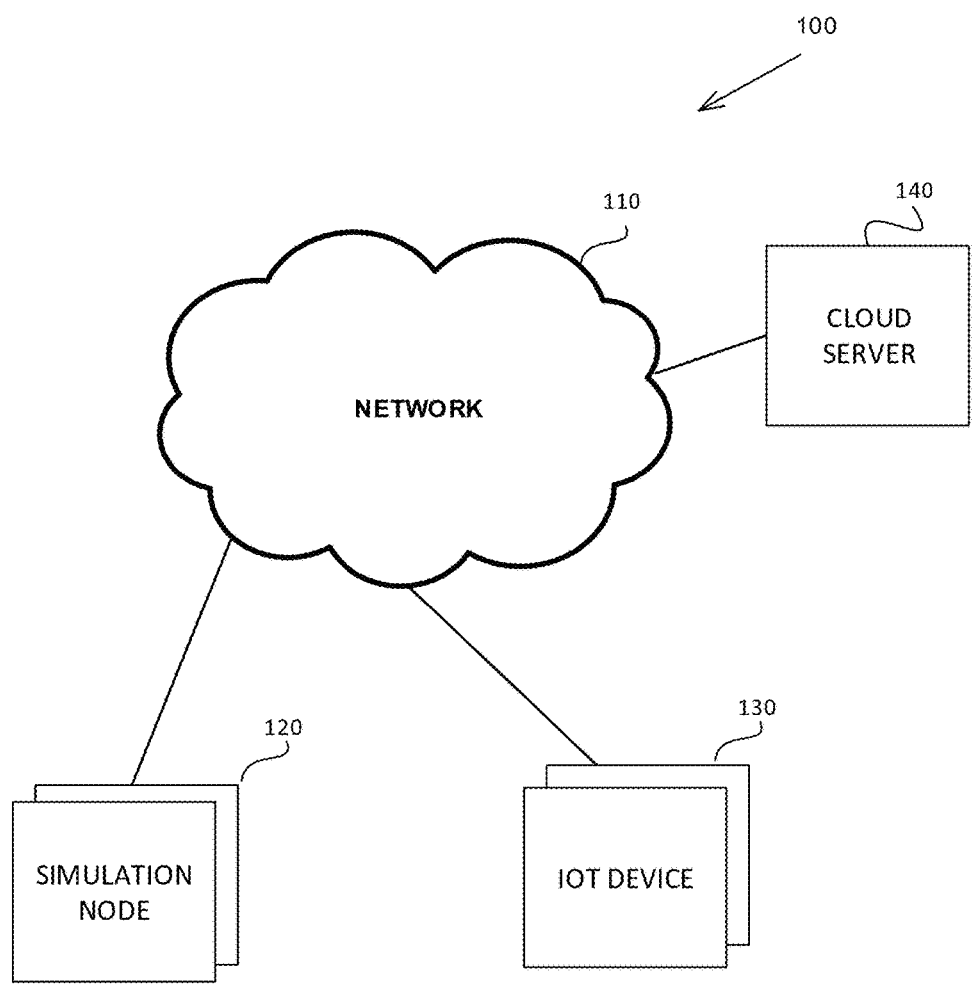
FIG. 1 shows a schematic illustration of a computerized environment, in accordance with some exemplary embodiments of the disclosed subject matter.

One technical problem dealt with by the disclosed subject matter is to provide for an infrastructure capable of simulating large scale IoT applications that are fed by a large number of IoT devices.

One technical solution is to utilize an IoT execution environment and have connected thereto one or more simulation nodes. In addition to the simulation nodes, additional (non-simulated) IoT devices may also be connected to the IoT execution environment and inter-operate together with the simulation nodes. Communication protocols such as MQ Telemetry Transport (MQTT) may be utilized by the simulation nodes and participating devices may thus be unaware of which node is an actual devices and which node is a simulation node. In some exemplary embodiments, from an application point of view, the simulation node may be undistinguishable from actual (non-simulated) IoT devices.

A simulation node may comprise a device model and a real-world model. The device model may be a parametric model indicative of an operation of device based on world parameters representing the environment surrounding and affecting the behavior of the device. The device model may be fed by values set by the real-world model. The real-world model may provide a modeling of the environment or surrounding of the device, and any measurable attribute external to the device and potentially affecting the device behavior. A single real-world model may be utilized for simulating many different devices, thereby preserving consistency therebetween. It is noted though that different simulated devices or different types of simulated devices may be fed with different sets of world parameters. For example, a simulated car including simulated odometer and GPS sensors may be fed simulated location and speed values, while a simulated air-conditioner including a simulated thermometer and humidity meter may be fed with simulated temperature and humidity values, even though both simulated devices may be fed with simulated world parameters generated by the same real-world model.

In some exemplary embodiments, the simulation node may determine which of a set of plurality of simulated device is to be simulated. Simulation of the model may be performed by invoking the real-world model and using its output as parameters for the device model representing the simulated device. Outcomes of the simulation may be provided to the IoT cloud itself.

In some exemplary embodiments, during simulation, a next event may be generated in a random manner, stochastic manner, pseudo-random manner, or the like. The next simulated event may represent a next simulated action that is designated to be performed by the simulation node in simulating one of the IoT devices. A simulation node may retain information about a next simulated event to occur and timing thereof. Upon handling of the next simulated event, a new next event may be determined. In such a manner, aggregation of simulated devices to a single node may reduce memory requirements, as instead of having N next events that are derived from the number of simulated devices, N, a single next event may be retained for all devices simulated by the same simulation node. Additionally or alternatively, a sequence of M next events may be generated and retained in memory until being executed, where M may be significantly smaller than N, e.g., M may be smaller than about 1%, 5%, or 10% of N.

In some exemplary embodiments, the number of simulation nodes or their communication ports may be defined set at about a maximal number of simultaneous messages that the IoT cloud may handle (e.g., ±20%). Such a number may be significantly lower than the total number of IoT devices, and therefore may provide for a more efficient simulation environment requiring significantly reduced amount of resources.

In some exemplary embodiments, the disclosed subject matter may utilize lazy implementation of device registration and have on-the-fly device registration of simulated devices that is performed only for devices that contribute to the simulated execution according to a generated sample path.

One technical effect of utilizing the disclosed subject matter is to enable simulation of potentially new devices in an existing, potentially execution platform, instead of in a dedicated testing/integration environment.

Referring now to FIG. 1 showing a schematic illustration of a computerized environment, in accordance with some exemplary embodiments of the disclosed subject matter.

Environment 100 comprises Network 110 connecting a plurality of computerized devices, such as IoT Devices 130, a Cloud Server 140 and Simulation Nodes 120. IoT Device 130 may be an actual physical IoT device deployed in the field. Cloud Server 140 may be a server receiving data from IoT Devices 130 and potentially analyzing such data.

A Simulation Node 120 may be implemented by a computerized device that is connected to Network 110 and provide for simulated activity of one or more IoT devices. In some exemplary embodiments, each Simulation Node 120 may aggregate the simulation of many IoT devices. In some exemplary embodiments, Simulation Node 120 may track a real-world state that is consistent between the different simulated IoT devices. Additionally or alternatively, regardless of the number of simulated IoT devices simulated by Simulation Node 120, Simulation Node 120 may keep track of a single next simulated event to occur, such as a next message to be transmitted by a simulated IoT device using MQTT protocol.

In some exemplary embodiments, a simulated IoT device may register on-the-fly in response to a determination that the simulated IoT device will participate and transmit data to Cloud Server 140.

In some exemplary embodiments, simulated IoT devices and actual IoT devices may not be distinguishable by an application receiving messages therefrom, such as Cloud Server 140.

Figure 2A:
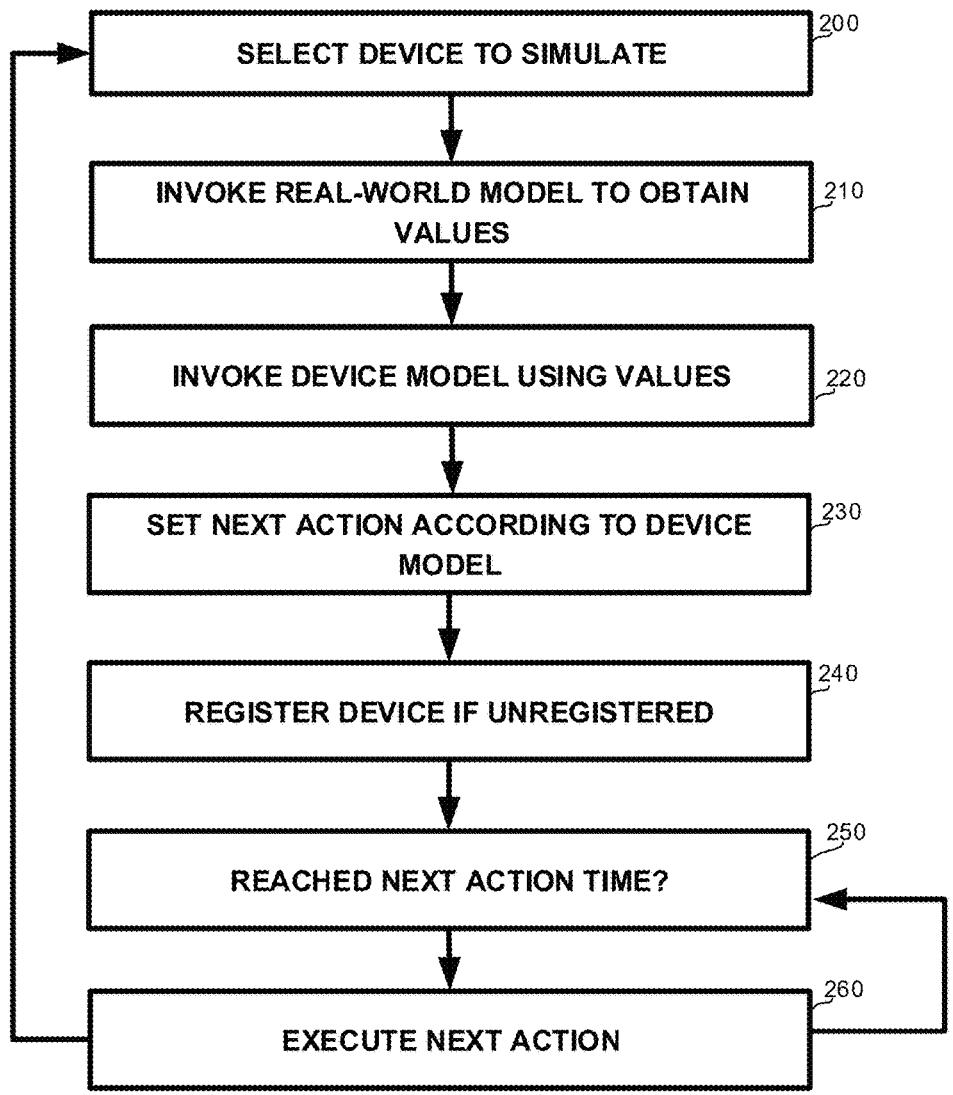
FIG. 2A shows a flowchart diagram of a method, in accordance with the disclosed subject matter.

Referring now to FIG. 2A showing a flowchart diagram of a method, in accordance with the disclosed subject matter. In some exemplary embodiments, the method may be performed by a simulation node, such as 120 of FIG. 1.

On Step 200, a device to be simulated may be selected. In some exemplary embodiments, the simulation node may be able to simulate a plurality of instances of a device type. The selection may be a selection of a specific instance to simulate. Additionally or alternatively, the simulation node may be able to simulate a plurality of IoT devices of different types. The selection may be a selection of a type of IoT device to simulate and an instance of such IoT device type.

On Step 210, a real-world model may be invoked to determine a state of the modeled real-world values. The real-world model may be a computer program product that is configured to simulate the environment in which the simulated IoT devices operate. As an example, the real-world model may be configured to determine temperature, humidity and other measurements at different locations that may be sensed by IoT devices. Additionally or alternatively, the real-world model may be configured to provide events that the IoT devices may respond to, such as but not limited to a person performing a predetermined action (e.g., running, falling, etc.), a vehicle entering a location, or the like.

In some exemplary embodiments, the simulated IoT devices may be connected cars and the real-world model may be useful in modeling the environment in which the connected cars operate. Measurements of the car, such as the position, velocity and acceleration of the car, may be derived from IoT devices behavior. The real-world model may provide for a Kinematic-based model of such measurements. Weather conditions, such as temperature, humidity, or the like may be derived from historical data of a geographic location in which the car is simulated. Road conditions may be modeled based on geophysical data in the geographic location. In some exemplary embodiments, the real-world model values for weather conditions and road conditions may be consistent for different IoT devices located in a same geographical location.

Additionally or alternatively, the real-world model may be a smart house real-world model. The real-world model may comprise heating/cooling systems that are derived from the behavior of (potentially simulated) IoT devices. The outcome of the operation of the heating/cooling systems may be modeled using thermodynamics laws. In-house activities, such as wake up-time, home leaving/entering, or the like, which may be part of the real-world model, may be modeled using behavioral models, statistical models, historical data, combination thereof, or the like. Weather conditions in the real-world model may be modeled using historical data of a geographic location in which the house is located.

In some exemplary embodiments, the disclosed subject matter may utilize any set of IoT devices, such as IoT-enabled home appliance reporting technical information to cloud appliance vendor, IoT-enabled sensors to monitor working conditions inside office building, or the like.

On Step 220, the device model of the device selected in Step 200 may be invoked, together with parameters provided by the real-world model. The device model may retain a state of the device and based on the simulated environment as represented by the real-world model, may determine a next state of the device and potential action. In some exemplary embodiments, some next states may be associated with performing an action while others may not (e.g., a measurement that is below a threshold may not invoke an action by the device).

Based on the output of the device model, a next action may be set on Step 230. The next action may be the action defined by the device model to occur. In some exemplary embodiments, the action may be set only if it provides output to a device that is external to the simulated device (e.g., transmit message to another device or to the cloud server). The action may be set to be performed in a future time, such as in 20 minutes, in an hour or the like. In some exemplary embodiments, a single next action may be set for the simulation node albeit the simulation node representing a plurality of devices. In some exemplary embodiments, refraining from setting a next action for each device may provide significant memory usage reduction, as a number of IoT devices s simulated by each node may be significant (e.g., thousands, tens of thousands, millions, or the like).

On Step 240, on-the-fly registration of the simulated IoT device may be performed, if required. In some exemplary embodiments, the simulated IoT devices may be registered only when they are determined to participate (e.g., send a message to a device external therefrom). In some exemplary embodiments, registration overhead may be avoided for a substantial number of devices which may be simulated but which may not participate in the simulation in a manner effecting other devices.

On Step 250, a determination may be performed whether a time of the next action was reached. If not, the method may stall and wait for the time to pass. In case the time of the next action was reached, the next action may be executed (Step 260). Following the execution of the next action, another next action may be generated and simulated (Steps 200-260).

Figure 2B:
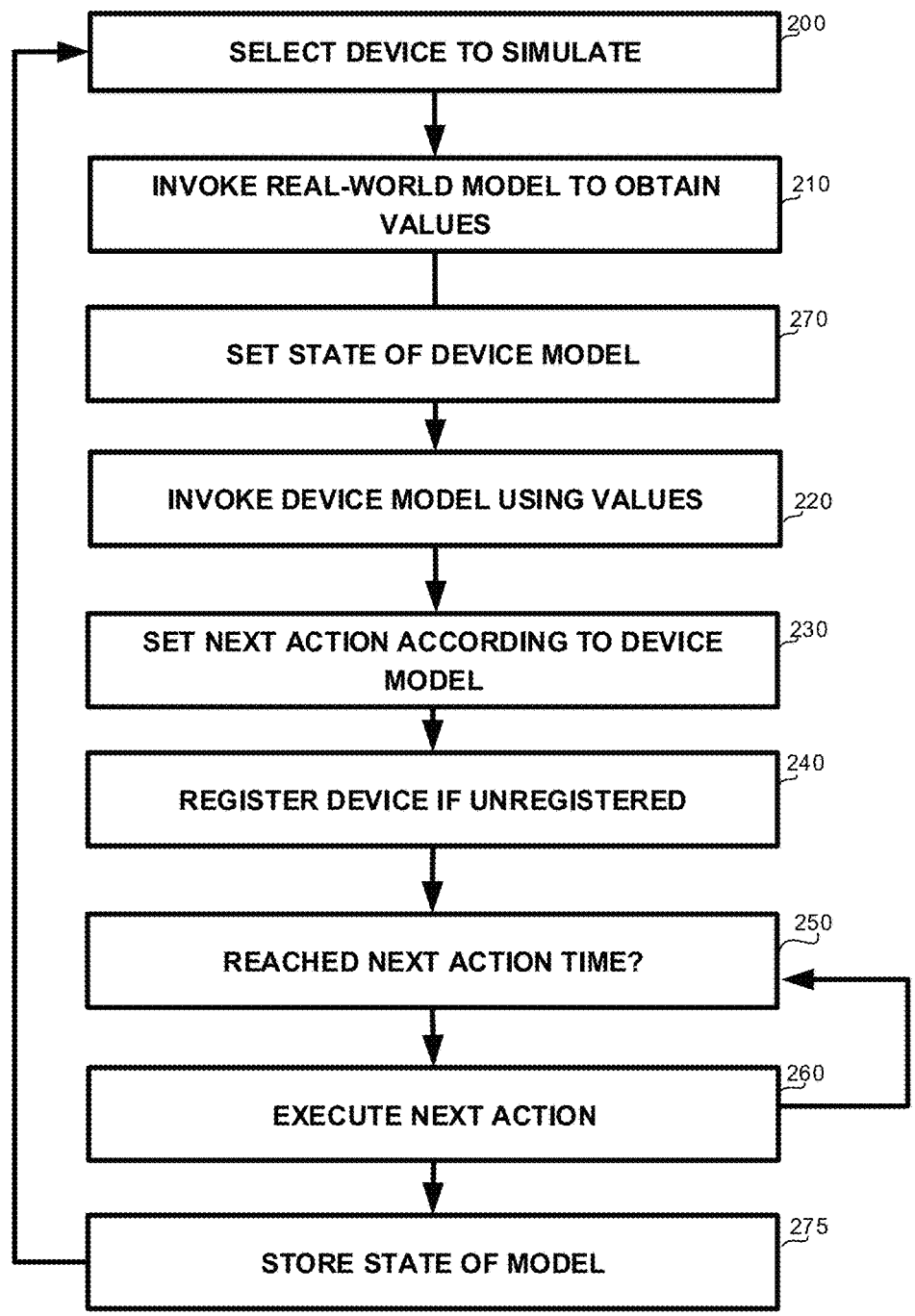
FIG. 2B shows a flowchart diagram of a method, in accordance with the disclosed subject matter.

Referring now to FIG. 2B showing a flowchart diagram of a method, in accordance with the disclosed subject matter. The method depicted in FIG. 2B utilizes a stateful device model. On Step 270, after the device to be simulated is selected (200), and prior to the invocation of the device model (220), the state of the model simulating the selected instance may be set. The state of the model may be retrieved from a computer-readable storage, such as a state repository comprised by the simulation node.

After the device model is invoked (275) and prior to the selection of a different instance (200), the state of the model simulating the instance may be stored in a computer-readable storage. The state may be stored so as to be later on retrieved and set to the model if the same instance is simulated once more.

Figure 3:
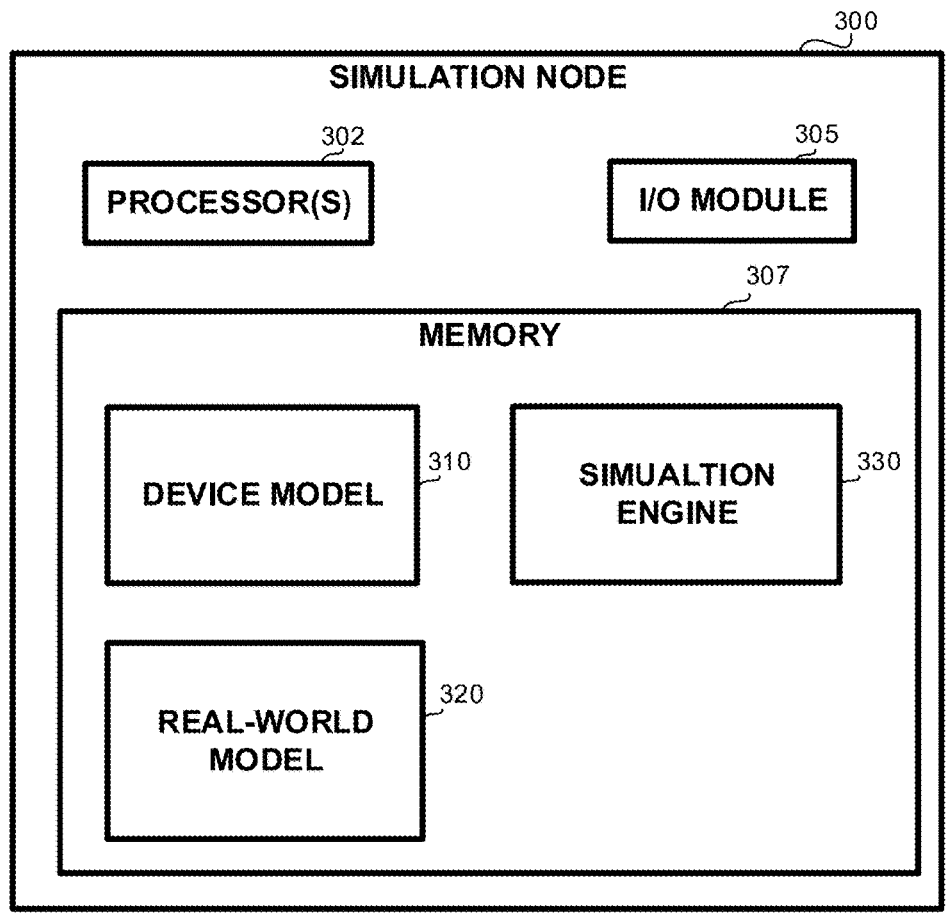
FIG. 3 shows an apparatus, in accordance with some exemplary embodiments of the disclosed subject matter.

Referring now to FIG. 3 showing an apparatus, in accordance with some exemplary embodiments of the disclosed subject matter.

In some exemplary embodiments, Apparatus 300 may be configured to perform simulation of a plurality IoT devices in accordance with the disclosed subject matter. In some exemplary embodiments, Apparatus 300 may be configured to perform the method of FIG. 2. In some exemplary embodiments, Apparatus 300 may be a simulation node, such as 120 of FIG. 1.

Apparatus 300 may comprise one or more Processor(s) 302. Processor 302 is may be a Central Processing Unit (CPU), a microprocessor, an electronic circuit, an Integrated Circuit (IC) or the like. Processor 302 may be utilized to perform computations required by Apparatus 300 or any of it subcomponents.

In some exemplary embodiments of the disclosed subject matter, Apparatus 300 may comprise an Input/Output (I/O) Module 305. I/O Module 305 may be utilized to provide an output to and receive input from a user, a computerized apparatus or another apparatus similar to Apparatus 300.

In some exemplary embodiments, Apparatus 300 may comprise a Memory 307. Memory 307 may be a hard disk drive, a Flash disk, a Random Access Memory (RAM), a memory chip, or the like. In some exemplary embodiments, Memory 307 may retain program code operative to cause Processor 302 to perform acts associated with any of the subcomponents of Apparatus 300.

Device Model 310 may be configured to simulate operation of a device. In some exemplary embodiments, a single model may be used to simulate operation of a plurality of instances of a device of a same type. Additionally or alternatively, various models may be retained by Apparatus 300, each associated with a different type of IoT device. In some exemplary embodiments, Device Model 310 may be a stateful model, retaining a state of each device. Additionally or alternatively, Device Model 310 may be stateless. Additionally or alternatively, Device Model 310 may be a stateful model, the state of which may be set before the instance is being simulated using a retained state which was stored after a previous simulation of the same instance and before invocation of a different instance. In some exemplary embodiments, Device Model 310 may make use of random or pseudo random mechanisms to determine its operation, thereby simulating non-deterministic behavior.

Real-World Model 320 may be configured to simulate environment in which the devices operate. Real-World Model 320 may be set to determine the state of the o environment using random or pseudo random mechanisms. In some exemplary embodiments, Real-World Model 320 may be configured to simulate stochastic environment in accordance with some distribution on the events occurring therein.

In some exemplary embodiments, Device Model 310 may receive as input parameters determined by Real-World Model 320, such as measurement in the vicinity of the simulated device, events occurring and affecting the device, or the like.

Simulation Engine 330 may be configured to provide for aggregated simulation of a plurality of devices using Device Model 310 and using Real-World Model 320. In some exemplary embodiments, Real-World Model 320 may be used in a consistent manner ensuring the simulated environment is the same for all devices, thereby avoiding unrealistic simulations, such as providing contradicting measurements from two IoT devices that are located in proximity to one another, when such IoT devices are functioning properly.

It is understood in advance that although this disclosure includes a detailed description on cloud computing, implementation of the teachings recited herein are not limited to a cloud computing environment. Rather, embodiments of the present disclosed subject matter are capable of being implemented in conjunction with any other type of computing environment now known or later developed.

For convenience, the Detailed Description includes the following definitions which have been derived from the "Draft NIST Working Definition of Cloud Computing" by Peter Mell and Tim Grance, dated Oct. 7, 2009, which is cited in an IDS filed herewith, and a copy of which is attached thereto.

Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure comprising a network of interconnected nodes.

Figure 4:
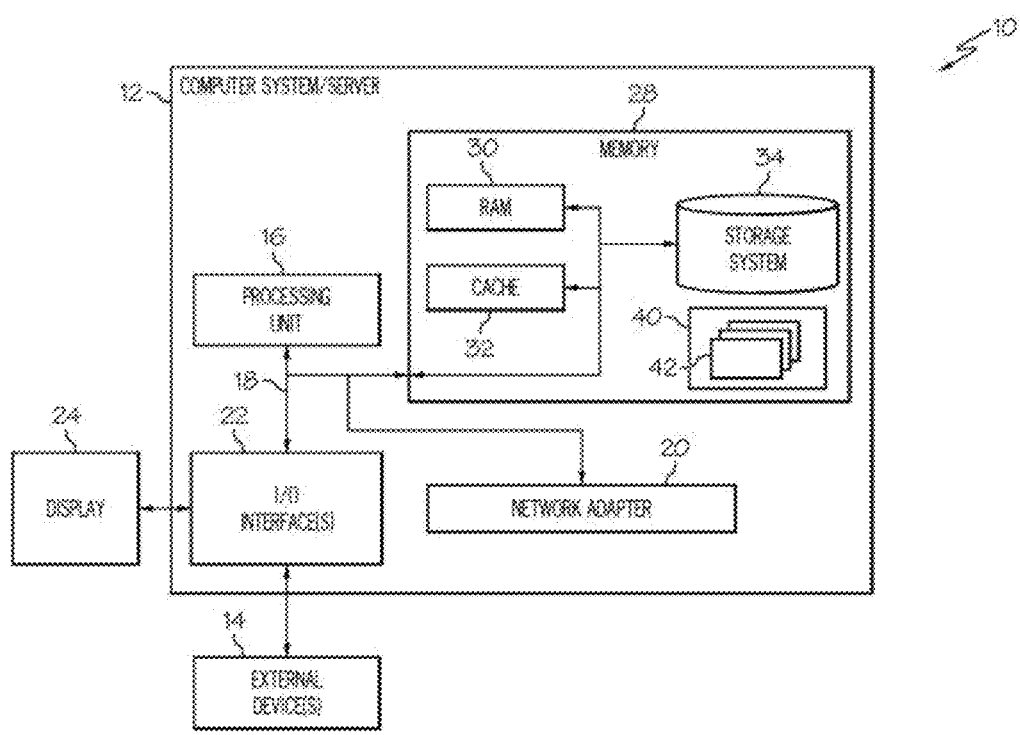
FIG. 4 depicts a cloud computing node according to an embodiment of the present disclosed subject matter.

Referring now to FIG. 4, a schematic of an example of a cloud computing node is shown. Cloud computing node 10 is only one example of a suitable cloud o computing node and is not intended to suggest any limitation as to the scope of use or functionality of embodiments of the disclosed subject matter described herein. Regardless, cloud computing node 10 is capable of being implemented and/or performing any of the functionality set forth hereinabove.

In cloud computing node 10 there is a computer system/server 12, which is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12 may be described in the general context of computer system-executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 4, computer system/server 12 in cloud computing node 10 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the disclosed subject matter.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the disclosed subject matter as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication can occur via I/O interfaces 22. Still yet, computer system/server 12 can communicate with one or more networks such as a local area network (LAN), a general wide area network (WAN), and/or a public network (e.g., the Internet) via network adapter 20. As depicted, is network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, external disk drive arrays, RAID systems, tape drives, and data archival storage systems, etc.

Figure 5:
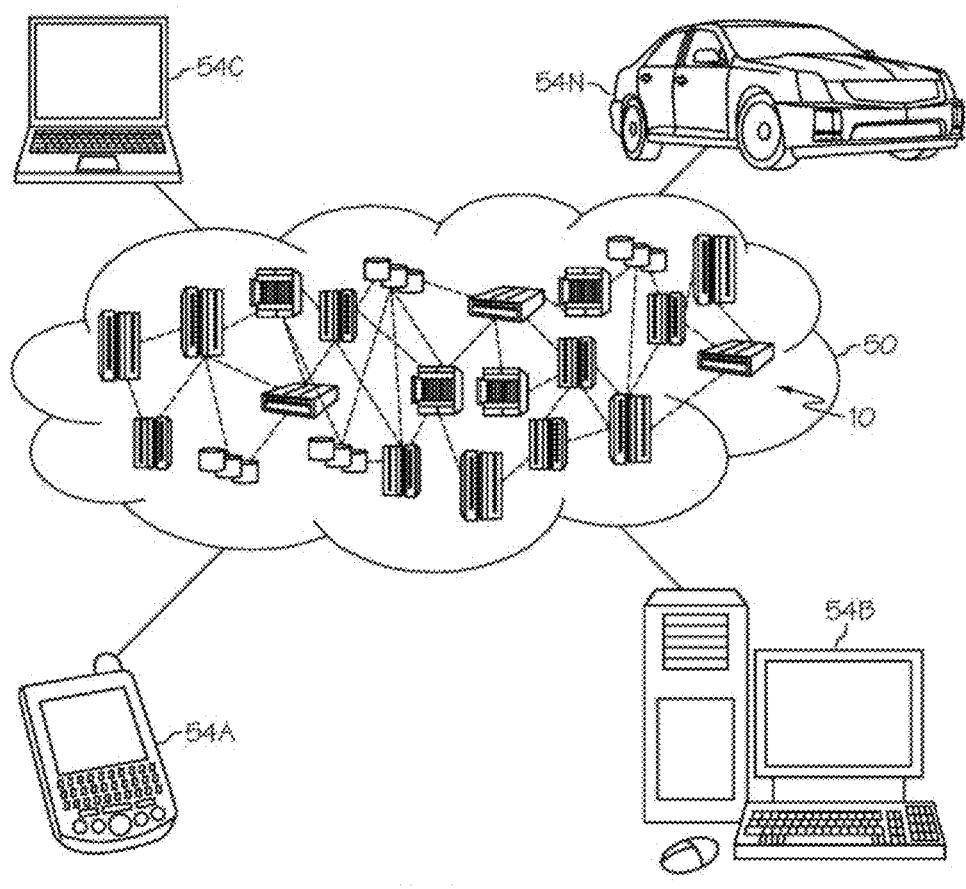
FIG. 5 depicts a cloud computing environment according to an embodiment of the present disclosed subject matter.

Referring now to FIG. 5, illustrative cloud computing environment 50 is depicted. As shown, cloud computing environment 50 comprises one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 5 are intended to be illustrative only and that computing nodes 10 and cloud computing environment 50 can communicate with any type of computerized device over any type of network and/or network addressable connection (e.g., using a web browser).

Figure 6:
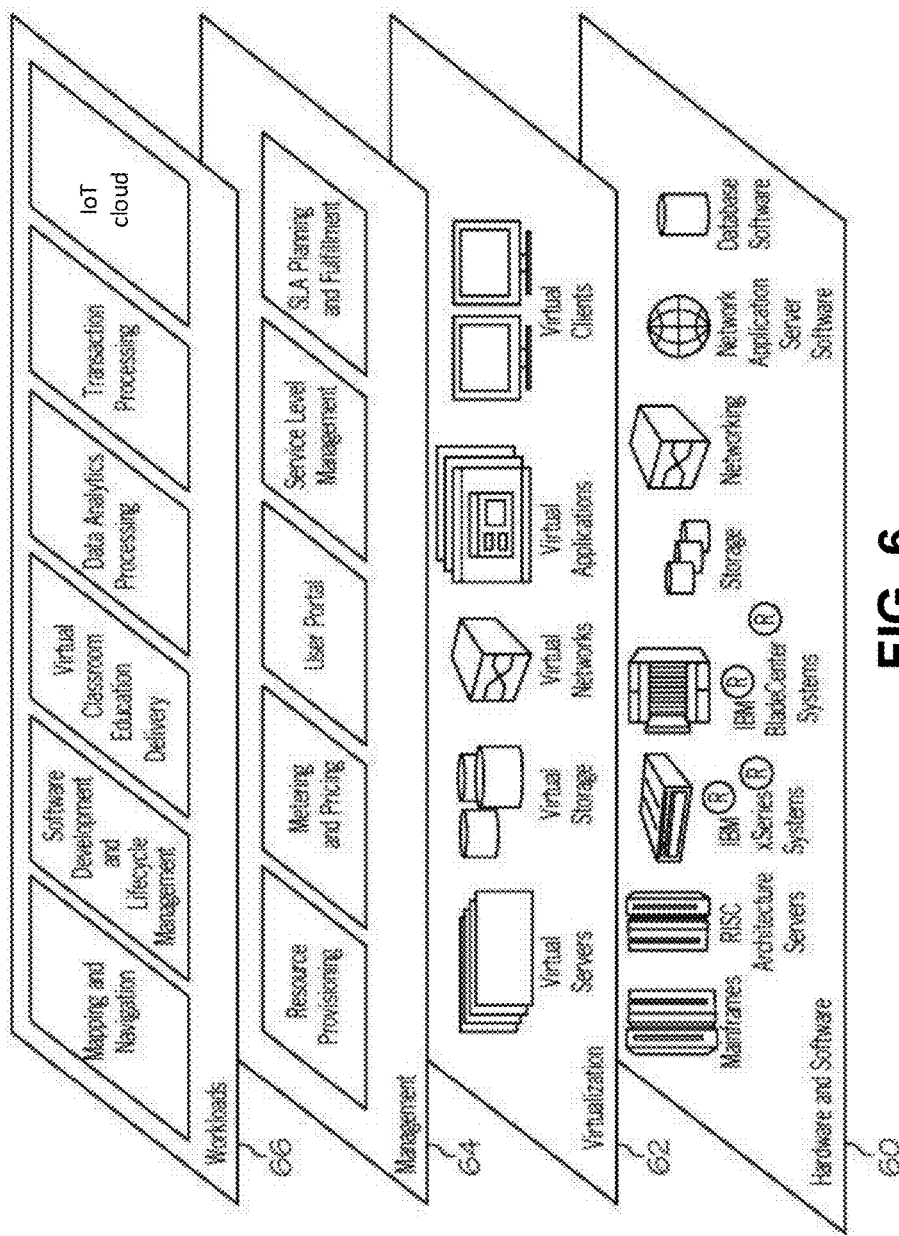
FIG. 6 depicts abstraction model layers according to an embodiment of the present disclosed subject matter.

Referring now to FIG. 6, a set of functional abstraction layers provided by cloud computing environment 50 (FIG. 5) is shown. It should be understood in advance that the components, layers, and functions shown in FIG. 6 are intended to be illustrative only and embodiments of the disclosed subject matter are not limited thereto. As depicted, the following layers and corresponding functions are provided:

Hardware and software layer 60 includes hardware and software components. Examples of hardware components include mainframes, in one example IBM® zSeries® systems; RISC (Reduced Instruction Set Computer) architecture based servers, in one example IBM pSeries® systems; IBM xSeries® systems; IBM BladeCenter® systems; storage devices; networks and networking components. Examples of software components include network application server software, in one example IBM WebSphere® application server software; and database software, in one example IBM DB2® database software. (IBM, zSeries, pSeries, xSeries, BladeCenter, WebSphere, and DB2 are trademarks of International Business Machines Corporation registered in many jurisdictions worldwide)

Virtualization layer 62 provides an abstraction layer from which the following examples of virtual entities may be provided: virtual servers; virtual storage; virtual networks, including virtual private networks; virtual applications and operating systems; and virtual clients.

In one example, management layer 64 may provide the functions described below. Resource provisioning provides dynamic procurement of computing resources and other resources that are utilized to perform tasks within the cloud computing environment. Metering and Pricing provide cost tracking as resources are utilized within the cloud computing environment, and billing or invoicing for consumption of these resources. In one example, these resources may comprise application software licenses. Security provides identity verification for cloud consumers and tasks, as well as protection for data and other resources. User portal provides access to the cloud computing environment for consumers and system administrators. Service level management provides cloud computing resource allocation and management such that required service levels are met. Service Level Agreement (SLA) planning and fulfillment provide pre-arrangement for, and procurement of, cloud computing resources for which a future requirement is anticipated in accordance with an SLA.

Workloads layer 66 provides examples of functionality for which the cloud computing environment may be utilized. Examples of workloads and functions which may be provided from this layer include: mapping and navigation; software development and lifecycle management; virtual classroom education delivery; data analytics processing; transaction processing; and IoT cloud receiving, analyzing, processing and responding to data provided by the IoT devices. In some exemplary embodiments, IoT cloud may also transmit instructions to IoT devices to set their operation mode. For example, an IoT device associated with an A/C may be instructed to set the A/C at a specific state.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, o the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method performed by a simulation node in an Internet of Things (IoT) environment, the simulation node comprising memory and a processor, the IoT environment comprises the simulation node and a cloud server connected by a computerized network, the method comprising:

selecting a simulated IoT device to simulate from a plurality of simulated IoT devices that are being simulated by the simulation node,
wherein the IoT environment further comprises IoT devices utilizing a same communication protocol as the selected simulated IoT device, wherein the cloud server is incapable of distinguishing between simulated and non-simulated IoT devices;
invoking a real-world model to obtain real-world simulated values;
determining a simulated behavior of the selected simulated IoT device by invoking a device model and providing the real-world simulated values thereto, wherein the simulated behavior comprises transmitting a message to the cloud server;
setting a next simulated action of the simulation node to occur at a designated time, wherein the next simulated action is the simulated behavior;
performing the next simulated action by the simulation node at the designated time; and
providing a simulation environment for the IoT environment that conserves memory resources by retaining a single next event in a single simulation node for all of the plurality of simulated IoT devices that are being simulated by the simulation node by aggregating the simulated IoT devices to the single simulation node.

2. The method of claim 1, wherein the simulation node retaining in memory a number of next simulated actions that is lower than a number of the plurality of simulated IoT devices.

3. The method of claim 2, wherein the simulation node retaining in memory a single next simulated action for the plurality of simulated IoT devices.

4. The method of claim 1, wherein the plurality of simulated IoT devices are not a-priori registered with the cloud server, wherein the method further comprises: performing on-the-fly device registration for the selected simulated IoT device, whereby a portion of the plurality of simulated IoT devices are registered on demand.

5. The method of claim 1 further comprises:
selecting a second simulated IoT device from the plurality of simulated IoT devices;
invoking the real-world model to obtain real-world simulated values, whereby real-world simulated values are consistent for the simulation of the selected simulated IoT device and the second simulated IoT device; and
simulating a behavior of the second simulated IoT device.

6. A method performed by a simulation node in an Internet of Things (IoT) environment, the simulation node comprising memory and a processor, the IoT environment comprises the simulation node and a cloud server connected by a computerized network, the method comprising:

selecting a simulated IoT device to simulate from a plurality of simulated IoT devices that are being simulated by the simulation node, wherein the IoT environment further comprises a plurality of simulation nodes, wherein a number of simulation nodes is a number of a maximal number of simultaneous messages that the cloud server is configured to handle, whereby the number of simulation nodes is no more than ten percent of a total number of simulated IoT devices simulated by the plurality of simulation nodes;
invoking a real-world model to obtain real-world simulated values;
determining a simulated behavior of the selected simulated IoT device by invoking a device model and providing the real-world simulated values thereto, wherein the simulated behavior comprises transmitting a message to the cloud server;
setting a next simulated action of the simulation node to occur at a designated time, wherein the next simulated action is the simulated behavior;
performing the next simulated action at the designated time; and
providing a simulation environment for the IoT environment that conserves memory resources by retaining a single next event in a single simulation node for all of the plurality of simulated IoT devices that are being simulated by the simulation node by aggregating the simulated IoT devices to the single simulation node.

7. A simulation node in an Internet of Things (IoT) environment, wherein the IoT environment comprises the simulation node and a cloud server connected by a computerized network, wherein the simulation node comprising:
a memory; and
a processor, wherein the processor is configured to perform a method comprising:
selecting a simulated IoT device to simulate from a plurality of simulated IoT devices that are being simulated by the simulation node;
invoking a real-world model to obtain real-world simulated values;
determining a simulated behavior of the selected simulated IoT device by invoking a device model and providing the real-world simulated values thereto, wherein the simulated behavior comprises transmitting a message to the cloud server;
setting a next simulated action of the simulation node to occur at a designated time, wherein the next simulated action is the simulated behavior;
performing the next simulated action at the designated time,
wherein the IoT environment further comprises a plurality of simulation nodes, wherein a number of simulation nodes is a number of a maximal number of simultaneous messages that the cloud server is configured to handle, whereby the number of simulation nodes is no more than ten percent of a total number of simulated IoT devices simulated by the plurality of simulation nodes; and
the simulation node is configured to provide a simulation environment for the IoT environment that converses memory resources by retaining a single next event in a single simulation node for all of the plurality of simulated IoT devices being simulated by the simulation node by aggregating the simulated IoT devices to the single simulation node.

8. The simulation node of claim 7, wherein the simulation node retaining in the memory a number of next simulated actions that is lower than a number of the plurality of simulated IoT devices.

9. The simulation node of claim 8, wherein the simulation node retaining in the memory a single next simulated action for the plurality of simulated IoT devices.

10. The simulation node of claim 7, wherein the plurality of simulated IoT devices are not a-priori registered with the cloud server, wherein said processor is further configured to perform on-the-fly device registration for the selected simulated IoT device, whereby a portion of the plurality of simulated IoT devices are registered on demand.

11. The simulation node of claim 7, wherein said processor is further configured to perform:
selecting a second simulated IoT device from the plurality of simulated IoT devices;
invoking the real-world model to obtain real-world simulated values, whereby real-world simulated values are consistent for the simulation of the selected simulated IoT device and the second simulated IoT device; and
simulating a behavior of the second simulated IoT device.

12. The simulation node of claim 7, wherein the IoT environment further comprises IoT devices utilizing a same communication protocol as the selected simulated IoT device, wherein the cloud server is incapable of distinguishing between simulated and non-simulated IoT devices.

* * * * *